United States Patent
Beyne et al.

(12)

(10) Patent No.: US 6,506,664 B1
(45) Date of Patent: Jan. 14, 2003

(54) METHOD OF TRANSFERRING ULTRA-THIN SUBSTRATES AND APPLICATION OF THE METHOD TO THE MANUFACTURE OF A MULTI-LAYER THIN FILM DEVICE

(75) Inventors: Eric Beyne, Leuven (BE); Augustin Coella-Vera, Pibrac (FR)

(73) Assignees: IMEC VZW (BE); Alcatel, Paris (FR)

( * ) Notice: Subject to any disclaimer, the term of this patent is extended or adjusted under 35 U.S.C. 154(b) by 0 days.

(21) Appl. No.: 09/541,995

(22) Filed: Apr. 3, 2000

(30) Foreign Application Priority Data

Apr. 2, 1999 (EP) .............................. 99201061

(51) Int. Cl.⁷ ............................................ H01L 21/322
(52) U.S. Cl. ..................... 438/455; 438/458; 438/459; 438/464
(58) Field of Search ................. 438/118, 455, 438/458, 459, 462, 464, 107, 456, 457, 460, 461, 463, 465

(56) References Cited

U.S. PATENT DOCUMENTS

| | | | |
|---|---|---|---|
| 5,256,562 A | | 10/1993 | Vu et al. |
| 5,324,687 A | | 6/1994 | Wojnarowski |
| 5,422,513 A | | 6/1995 | Marcinkiewica et al. |
| 5,455,202 A | * | 10/1995 | Malloy et al. .............. 438/118 |
| 5,656,552 A | * | 8/1997 | Hudak et al. ................ 438/15 |

FOREIGN PATENT DOCUMENTS

| | | |
|---|---|---|
| DE | 19702121 C1 | 6/1998 |
| EP | 0075945 A2 | 4/1983 |
| EP | 0209173 A1 | 1/1987 |
| EP | 0631310 B1 | 6/1994 |
| EP | 0611 129 A2 | 8/1994 |
| EP | 658929 A1 * | 6/1995 |
| EP | 0729184 A2 | 2/1996 |
| WO | WO 92/17045 | 10/1992 |

OTHER PUBLICATIONS

Kato Takashi; Patent Abstracts of Japan, vol. 010, No. 050 (E–384), application No. 59060943e, date Mar. 3, 1984; entitled: "Manufacture of Multilayer Semiconductor Device.".

Robert Bruns, et al., ICMCM Proceedings '92, pp. 34–40. "Utilizing Three–Dimensional Memory Packaging and Silicon–on–Silicon Technology for Next Generation Recording Devices"

* cited by examiner

*Primary Examiner*—Caridad Everhart
*Assistant Examiner*—Craig P. Lytle
(74) *Attorney, Agent, or Firm*—Knobbe, Martens, Olson & Bear LLP

(57) ABSTRACT

The present invention provides a method of transfer of a first planar substrate with two major surfaces to a second substrate, comprising the steps of: forming the first planar substrate, attaching one of the major surfaces of the first planar substrate to a carrier by means of a release layer; attaching the other major surface of the first substrate to the second substrate with a curable polymer adhesive layer; partly curing the polymer adhesive layer, disconnecting the release layer from the first substrate to separate the first substrate from the carrier, followed by coing the polymer adhesive layer.

12 Claims, 15 Drawing Sheets

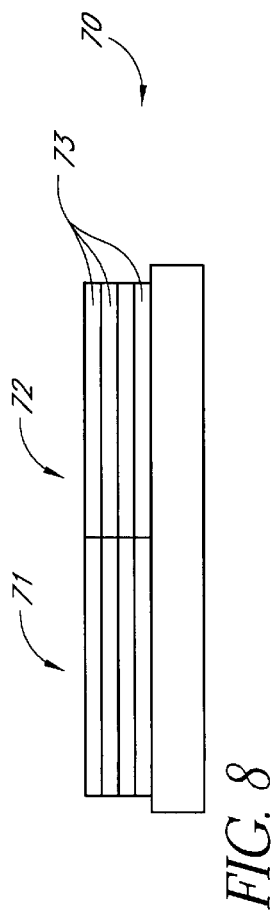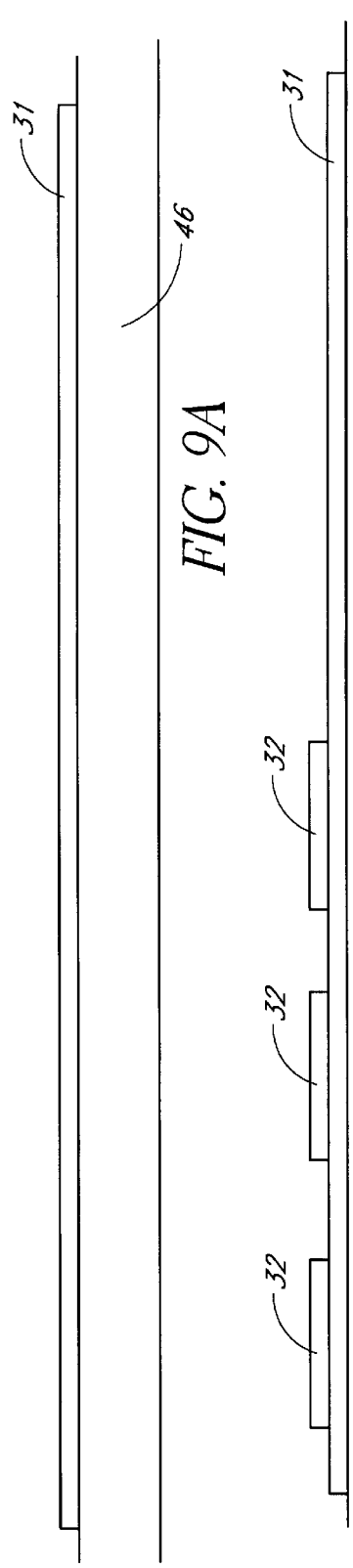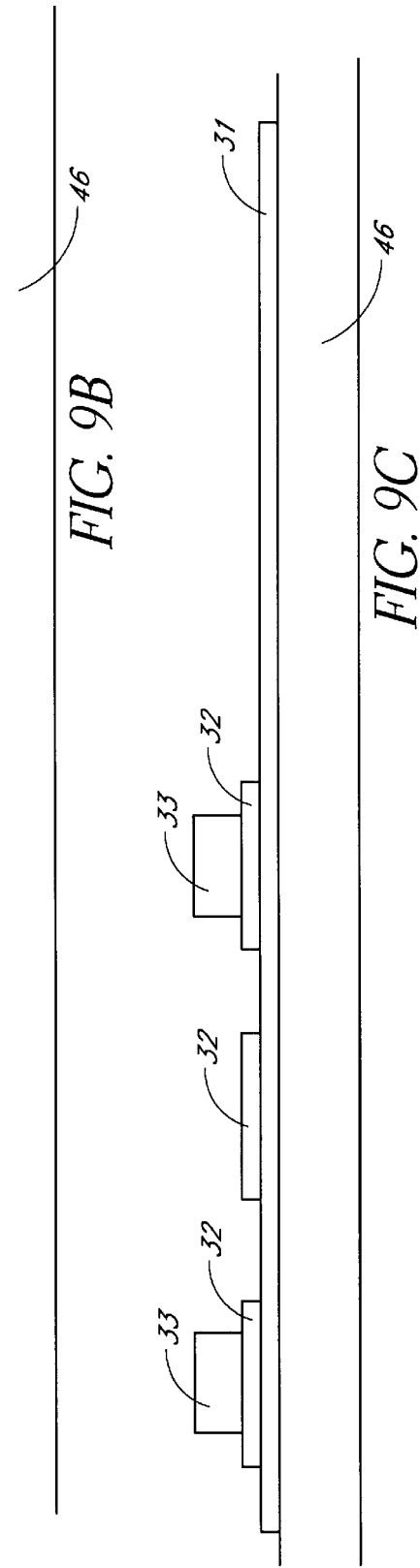
FIG. 8
FIG. 9A
FIG. 9B
FIG. 9C

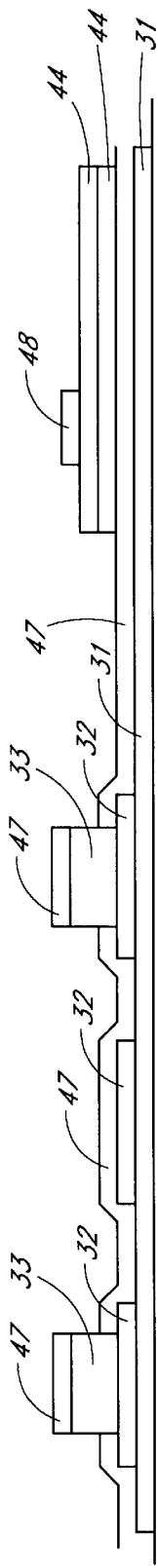
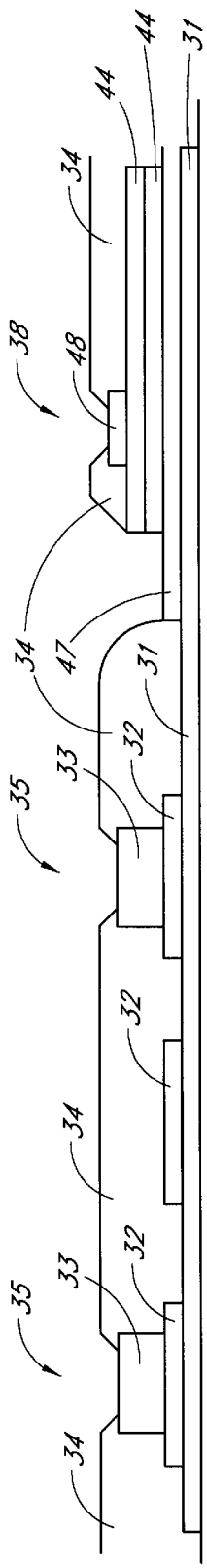
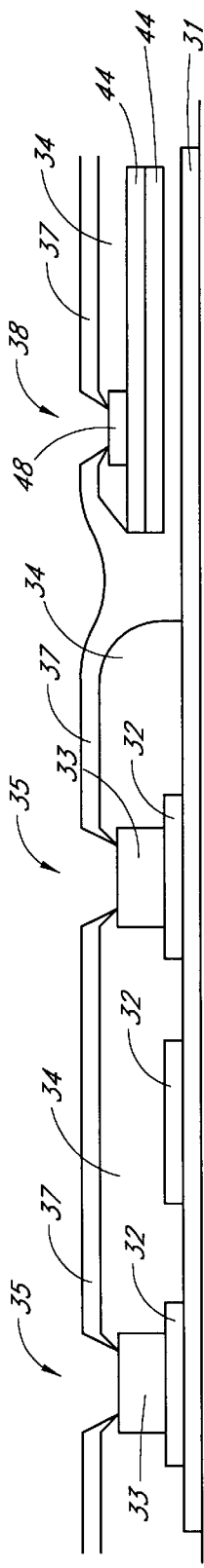
FIG. 9F
FIG. 9G
FIG. 9H

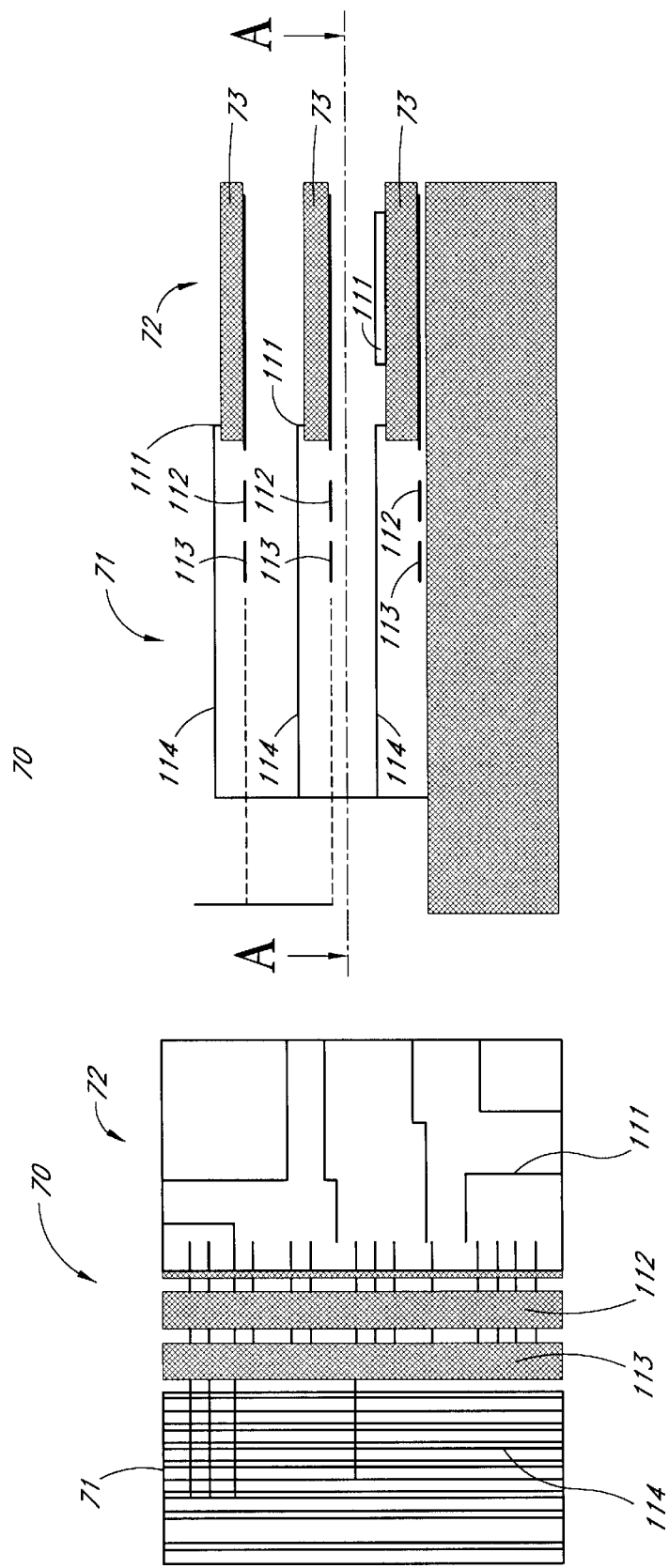
FIG. 10B: crossectional view
FIG. 10A: top view AA of 10B

METHOD OF TRANSFERRING ULTRA-THIN SUBSTRATES AND APPLICATION OF THE METHOD TO THE MANUFACTURE OF A MULTI-LAYER THIN FILM DEVICE

The present invention relates to a method of transferring ultra-thin substrates, in particular, semiconductor substrates including active devices as well as a multi-layer thin film device manufacturable using the transfer method.

TECHNICAL BACKGROUND

In order to try and increase density of packing of integrated circuits and semiconductor chips it is known to form a so called "cube" package consisting of a number of passivated device chips glued together in a stacked configuration. Conventionally these devices are connected via one of the side surfaces of the cube which is perpendicular to the layers of chips. One such known connection method is shown in FIG. 1 which is described in EP 631 310. It includes a cube of glued chips 1 with connections on one of the sides of the cube which is perpendicular to the layers of chips. The side connection connects through to the output pins 3 of a carrier 2. The cube is manufactured in the following way. Integrated circuit chips are formed on the upper surface of a wafer. Next a polymer adhesive material is applied to the top of the completed chips. The wafer is then diced and the plurality of integrated circuit chips are then stacked, one on top of another, using the adhesive to bond them together. The resulting cube structure is rather bulky as each layer of the stack includes both a chip and also a carrier (semiconductor wafer) for that chip.

A three-dimensional memory packaging is known from the article by Robert Bums, Warren Chase and Dean Frew, entitled "Utilising three-dimensional memory packaging and silicon on silicon technology for next generation recording devices", ICMCM Proceedings 1992, pages 34 to 40. The known device is shown schematically in FIG. 2 and includes a 3D memory 5 connected by solder to the X and Y wiring or "orouting", 6, 7 and the ground and source potential, 8, 9 of an MCM substrate 10 which may be built up on a silicon substrate 11. As with the device known from EP-631 310 the individual layers of the 3D memory 5 are stacked perpendicularly to the substrate 10 so that the complete assembly takes up quite a lot of space in the direction perpendicular to the substrate 10.

A semiconductor package stack module is known from EP 729 184 in which a large scale integrated circuit (LSI) is mounted via fine bumps on a ceramic carrier substrate or a flexible carrier film on which wiring conductors are formed. A plurality of such carrier substrates or carrier films are connected to each other by bumps via through holes which are electrically connected to the wiring conductors, thereby completing a three-dimensional stack module. This stack takes up quite a lot of room as each layer is relatively thick as it includes both a carrier layer and a chip. Further, the connections are made on one side of the cube resulting in the layers of chips being perpendicular to the substrate.

The above devices suffer from the problem that the cube packages are formed from relatively thick layers which not only makes them bulky but also negatively affects their thermal properties.

The handling of ultra-thin substrates, in particular semiconductor substrates such as semiconductor grade silicon, is difficult as such layers are brittle and are easily damaged. In addition the transfer of more than one layer to form a stack is particularly difficult as the previous transferred layer does not provide a perfectly flat base such that any attempt to transfer the next ultra-thin substrate may result in damage to this layer.

One method of transferring thin semiconductor substrates including active devices is described in U.S. Pat. No. 5,256,562. The method is not described in detail but it includes formation of thin film transistors on a first substrate. The transistor side of the substrate is then glued to a carrier substrate using an epoxy adhesive. The carrier may be glass. The first substrate would then appear to be removed although this step is not described and the carrier and the TFT's is transferred to a second substrate and adhered thereto with another adhesive (not specified). The glass carrier is then removed using hydrofluoric acid and the epoxy adhesive removed by oxygen plasma, sulphuric acid or boiling trichlorethylene. Alternatively, a removable epoxy is used to attach the glass carrier and this is removed by subjecting the epoxy adhesive to UV or microwave radiation, or chemicals (not specified) to destroy the adhesive properties of the epoxy layer. The epoxy layer is then removed by one of the methods described above. This known technique makes use of aggressive chemicals and complex procedures which means that the TFT's have to be protected by special layers. This makes the method inconvenient for commercial production. Further, no method is described of how to stack one layer of TFT's on another to form a three-dimensional structure of active devices. In fact, due to the use of aggressive chemicals the procedure is unsuitable for forming three-dimensional active structures.

AIMS OF THE INVENTION

It is an object of the present invention to provide a method of assembly of integrated circuit chips which allows the production of the stack of such chips with high density.

It is a further object of the present invention to provide a semiconductor device and a method of making the same which includes a three-dimensional structure of active and passive electronic devices which takes up less room than the known three-dimensional structures.

It is still a further object of the present invention to provide a method of safe transfer of very thin substrates, especially semiconductor substrates.

It is yet a further object of the present invention to provide a semiconductor device and a method of making the same having a three-dimensional structure of active and passive electronic devices which has better thermal and/or electrical properties than conventional devices.

SUMMARY OF THE INVENTION

The present invention may provide a method of transfer of a first planar substrate with two major surfaces to a second substrate, comprising the steps of: forming the first planar substrate; attaching one of the major surfaces of the first planar substrate to a carrier by means of a release layer; attaching the other major surface of the first substrate to the second substrate with a curable polymer adhesive layer; partly curing the polymer adhesive layer, and disconnecting the release layer from the first substrate to separate the first substrate from the carrier followed by curing the polymer adhesive layer.

The method may include the step of the curable adhesive being applied to the second substrate before the attaching step. The first substrate is preferably an ultra-thin semiconductor substrate formed by thinning a semiconductor substrate which is supported by the carrier and the release layer during the thinning operation. The semiconductor substrate may be provided with micro-trenches between dies which are formed on the surface to which the carrier is attached. The thinning of the semiconductor substrate should be continued until the trenches are reached. This results in an array of separated dies attached to the carrier by means of the release layer. By selective removal of these dies, the step of dicing the carrier can be avoided.

The present invention may also provide a multi-layer thin film device comprising: a plurality of layers, each layer including a planar three-dimensional interconnect portion having "X", "Y" and "Z" connection routings and adjacent thereto a planar semiconductor device portion, the semiconductor device portion being connected to the interconnect portion in each layer, the "X" and "Y" routings lying in the plane of the interconnect portion and the "Z" routing being perpendicular thereto, the "Z" routing in each interconnect portion being selectably distributed throughout the interconnect portion. A Z connection through one layer may be located at a different position than a Z connection in either the layer above or below this one layer despite the fact that the Z connections in the three adjacent layers may be connected together. The interlayer Z connections between two layers can be achieved by X or Y routings running on the surface of one of the layers. Hence, there is no need for vias going through more than one layer nor is there a need to use end or internal surfaces perpendicular to the layers for connection purposes. The Z routing through one layer is preferably achieved by means of a conductive stud which has a height substantially equal or somewhat less than the thickness of one layer, especially the thickness of an integrated circuit formed in the semiconductor portion associated with that layer. This reduces the depth of vias through insulating layers considerably which improves the accuracy of routings as deep vias with sloping walls which have a large footprint are no longer required.

The present invention also includes a method of forming a multi-layer thin film device; comprising the steps of:

step 1: attaching a semiconductor device to a substrate;

step 2: providing a planar three-dimensional interconnect portion on the substrate having "X", "Y" and "Z" connection routings adjacent to the semiconductor device, the semiconductor device being connected to the interconnect portion, the "X" and "Y" routings lying in the plane of the interconnect portion and the "Z" routing being perpendicular thereto, the "Z" routing in each interconnect portion being selectably distributed throughout the interconnect portion; and repeating steps 1 and 2 for each layer.

The present invention may also include a multi-layer thin film device comprising: a plurality of layers forming a stack of layers, each layer including a planar semiconductor device portion on an ultra-thin substrate, the planar semiconductor device portion having a metallisation layer, each layer being adhered to the next layer by a cross-linked polymeric adhesive layer; and a groove within the stack, the metallisation layer of each semiconductor device portion being exposed in said groove.

The dependent claims define further individual embodiments of the present invention.

The present invention its advantages and embodiments will now be described with reference to the following drawings.

BRIEF DESCRIPTION OF THE DRAWINGS

FIG. 8 is a schematic cross-sectional representation of a multi-layer thin film device in accordance with an embodiment of the present invention.

FIGS. 9A to 9K show schematic manufacturing steps for manufacturing the multi-layer thin film device shown in FIG. 8.

FIGS. 10A and B are schematic top- and side views of a multi-layer thin film device as shown in FIG. 8.

DESCRIPTION OF THE ILLUSTRATIVE EMBODIMENTS

The present invention will be described with reference to certain embodiments and to certain drawings but the present invention is not limited thereto but only by the claims. The drawings are schematic and non-limiting and certain dimensions have been exaggerated for clarity purposes. In particular, methods of transferring thin substrates will be described with reference to the fabrication of a three-dimensional structure of active devices but the present invention is not limited thereto but only by the attached claims.

Figure 1:
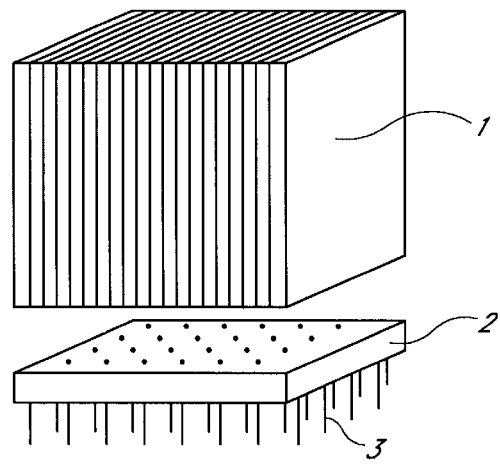
FIGS. 1 and 2 show prior art devices.
Figure 2:
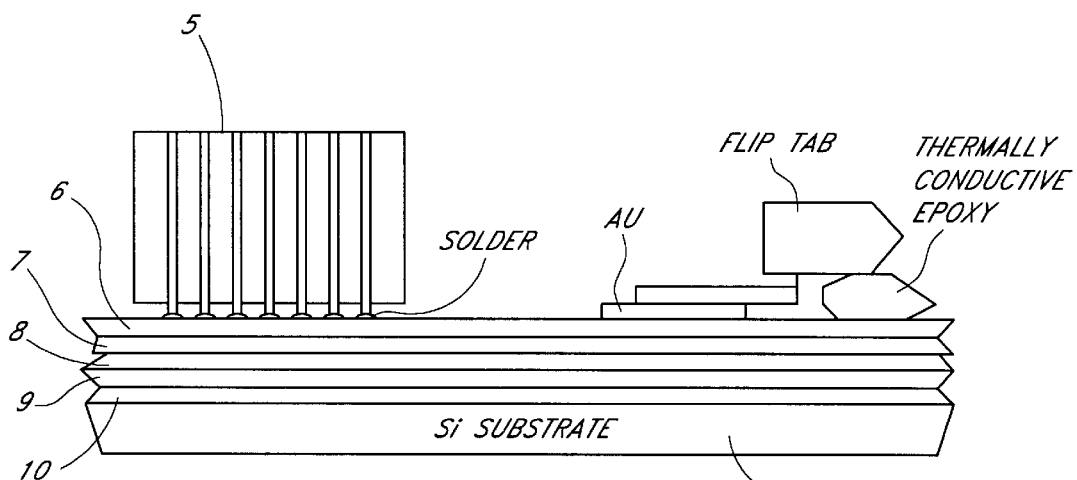
Figure 3A:
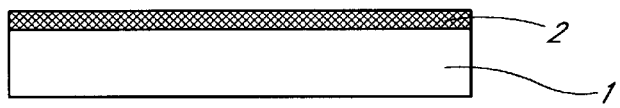
FIGS. 3A to 3F show schematically manufacturing steps for transferring an ultra-thin substrate in accordance with an embodiment of the present invention.
Figure 3B:
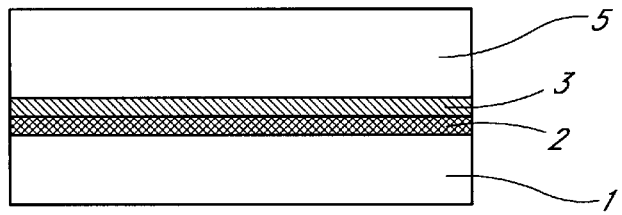

A method of forming and transferring an ultra-thin substrate in accordance with a first embodiment of the present invention will be described with reference to FIGS. 3A to 3F which show cross-sectional representations of the manufacturing steps required. FIG. 3A shows a planar first substrate 1. Substrate 1 may be one of a variety of suitable substrates, e.g. single crystal semiconductor silicon, semiconductor amorphous silicon, silicon on glass, silicon on sapphire or quartz. Active devices and/or passive devices 2 are formed in or on one major surface of the substrate 1 by conventional means such as, but not limited to, conventional semiconductor processing techniques, for example epitaxy. The devices 2 may be any suitable active or passive devices which may include a plurality of active and passive elements, e.g. an integrated circuit, CMOS transistors, thin film transistors, capacitors, resistors, memory arrays, micro- or nano-engineered devices such as UV or IR sensors, accelerometers, chemical or gas sensors, opto-electronic switches and circuits or similar. Substrate 1 may be a semiconductor wafer and the active devices 2 may be a plurality of integrated circuits or dies arranged on the wafer 1 in a pattern as is well known to the skilled person and which will be described in more details with reference to the second embodiment.

Substrate 1 is next attached to a carrier substrate 5 by means of a release layer 3 as shown schematically in FIG.

3B. Release layer 3 is preferably a layer which may be removed easily thermally and/or by solvents or by any other technique which provides low chemical, mechanical and thermal stress to the active devices 2. A thermal removal technique for release layer 3 should preferably not involve heating the devices 2 above 250° C., more preferably not above 200° C., and most preferably not above 150° C. Release layer 3 may be a photoresist layer having a good thermal stability, e.g. a melting point of 120° C. or more and preferably being soluble in a common solvent such as acetone. A suitable material for release layer 3 is photoresist A24562, available from Hoechst, Germany. The release layer 3 may be applied by spin-coating from a solvent solution. Alternatively, release layer 3 may be made of a wax.

Carrier 5 may be any suitable substrate, e.g. a further semiconductor substrate such as a single crystal silicon substrate, silicon on sapphire, silicon on glass, an alumina, a glass or a quartz substrate or a metal substrate such as aluminium.

Figure 3C:
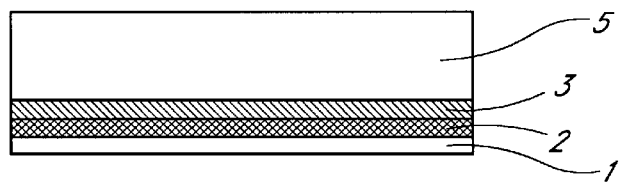

The other major surface of the substrate 1 is now optionally thinned by conventional grinding and polishing techniques, by reactive ion etching, by chemical-mechanical polishing (CMP) or similar to form an ultra-thin planar substrate 1,2 as shown schematically in FIG. 3C composed of the active devices 2 and what is left of the substrate 1. Substrate 1 may also be cleaved from the active devices 2 using any conventional technique, such as the mechanical separation technique using porous silicon as is known from EP 797 258, and substrate 1 may be re-used. The ultra-thin substrate 1,2 may have a thickness in the range 5–25 micron, and is mechanically supported and protected by the carrier 5. For example, the substrate thinning process may result in a thinned substrate 1,2 which from now on will be called a die 4, glued upside down on a supporting silicon chip carrier 5 using the spin-on release layer 3. When an ultra-thin die 4 is not required the thinning step may be omitted or may be terminated before an ultra-thin die 4 is obtained.

Figure 3D:
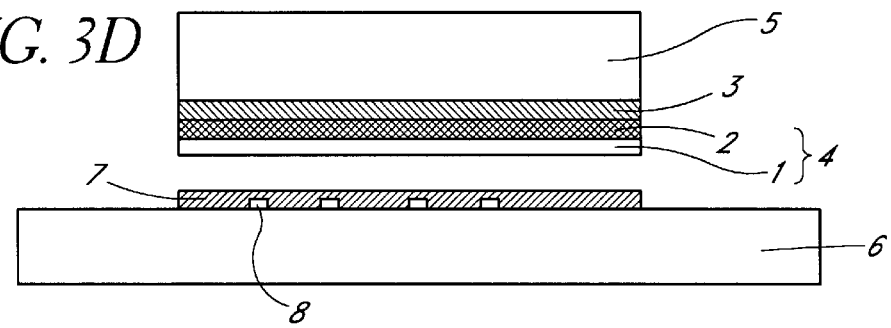
Figure 3E:
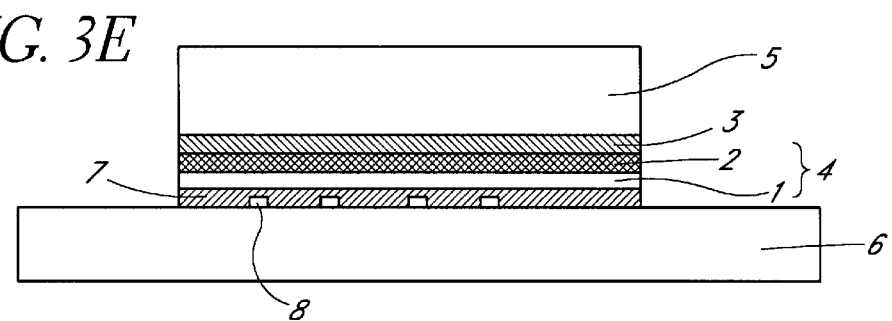

In the next step the die 4 with its devices 2 are attached to a second substrate 6 as shown schematically in FIG. 3E. Accurate placement of the die 4 on the second substrate 6 is preferable and may include the steps of:

S1. Accurate alignment of the die 4 to the second substrate 6 (e.g. preferably<+/−10 $\mu$m).

S2. Application of a thin adhesive layer 7 between die 4 and the second substrate 6 (e.g. preferably<5 $\mu$m). The adhesive layer 7 should preferably have a high adhesion strength, in particular sheer strength, low thermal resistance and be a highly uniform layer in order to allow stacking of further substrates on the top thereof.

In order to realise the first requirement, a flip-chip aligner/bonder may be used, for example as an FCG machine supplied by Karl Suss, France. Such a bonder has an alignment accuracy better than +/−3 $\mu$m. The stated machine is precise enough to get an overall accuracy of placement of +/−10 $\mu$m, taking into account possible movements of the die 4 after placement, e.g. during the removal of the carrier or the curing of the adhesive layer. Another advantage of this known machine is the good controllability of the die and second substrate temperature, as well as the applied force during bonding. Furthermore, temperature and force may be varied as a function of time in a rather general fashion.

For the second requirement, an adhesive layer 7 is preferred which is planarisable, is preferably easily applied, e.g. by spin-coating, is preferably resistant to any chemicals or thermal conditions used to remove or weaken the release layer 3, and is preferably insulating and has a high thermal conductivity. Preferably, the adhesive layer 7 is cross-linkable, i.e. curable, and that on-cure shrinkage is not excessive and there is no outgassing of gasses or water vapour or any bubble formation. Further, adhesive layer 7 is preferably a polymer adhesive layer. For the adhesive layer 7, a BCB material is preferred. In particular, Cyclotene™ grades supplied by-Dow of Dow, Midland, USA are preferred. One potential advantage of using BCB material is the reduction of the number of materials in the final structure, avoiding any non-compatibility problems as BCB may find use as a general insulating material in other parts of the final device. BCB may be applied in thin layers by spin-coating with excellent control on uniformity as shown schematically in FIG. 3D and explained below. The planarisation achievable with BCB is better than or equal to 80% and is usually better than 85%. If two layers of BCB are applied, planarisation better than 90% can be achieved.

Second substrate 6 may have an uneven upper surface as shown schematically in FIG. 3D as indicated by the irregularities 8. The adhesive layer 7 is preferably sufficiently planarisable to cover such irregularities 8 while providing a flat upper surface. One disadvantage of BCB is the poor thermal properties of the polymer. This may be overcome by using a very thin layer and optionally by the use of thermal conductors 8 in the layer 7 of BCB as shown schematically in FIGS. 3D and E. These thermal conductors are of such a height that they extend through a substantial portion of the thickness of the BCB layer 7 but not completely so that an insulating layer of BCB is still provided over the conductors 8. The purpose of the conductors 8 is to reduce the thermal resistance of the adhesive layer 7, thus improving the thermal properties of the die 4 when it is attached and operating. In accordance with the present invention, the BCB layer 7 is kept tacky and soft until the die attach process is finalised. Further, it is preferred to remove the carrier 5 and the release layer 3, without damage to the BCB layer 7. A suitable procedure to meet these requirements is:

S3. Spin coat a thin (3 $\mu$m) BCB layer 7 on the surface of the second substrate 6 covering any irregularities 8 and planarising the surface (FIG. 3D).

S4. Pre-bake the BCB layer 7 for 30 min at 30C to soften the BCB.

S5. "Flip-chip" attach the thinned die 4 (using carrier 5 as a support) on the soft BCB layer 7 (FIG. 3E). The temperature at BCB—die interface is preferably maintained at about 70° C., and the applied pressure to the die 4 is preferably about 80 kPa.

S6. Post-bake the BCB layer 7 for 2 hours at 120C (below the melting temperature of the release layer 3) in a nitrogen atmosphere. After this thermal treatment the adhesive layer 7 is partly hardened and it is resistant to solvents such as acetone.

S7. Remove the carrier 5 by placing the laminate 3, 4, 5, 6, 7 in acetone or another similar solvent to remove the release layer 3. The carrier 5 may be removed with a vacuum pipette.

S8. Remove any remaining photoresist on the surface of the die 4 by dipping in an acetone bath at room temperature.

Figure 3F:
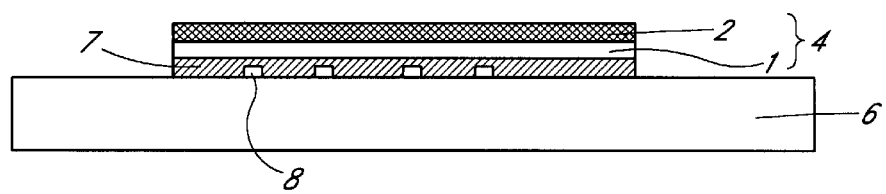

S9. Finally, completely curing the BCB layer 7 using the BCB curing profile recommended by the supplier of the BCB (FIG. 3F).

In order to test the adhesion strength of this method, some dummy 5×5 mm dies 4 were attached to a thin BCB layer 7, following the procedure described above. Then, a standard die-shear test was performed. An adhesion force in excess of 100 N was measured for the 5×5 mm device (>4 MPa). Sometimes after removing the carrier 5 from the thinned die 4, cracks may appear in the thin BCB layer 7. These disappear, however, after curing of the BCB layer 7 in step S9. This may be explained by the occurrence of some flow of the BCB during the temperature ramp-up of the curing process.

Figure 4A:
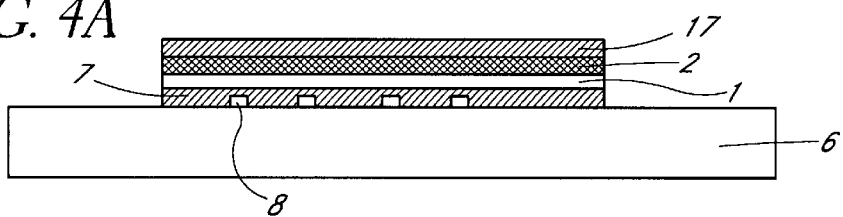
FIGS. 4A to 4E show schematically manufacturing steps to form a multi-layer stack of thin substrates in accordance with another embodiment of the present invention.
Figure 4B:
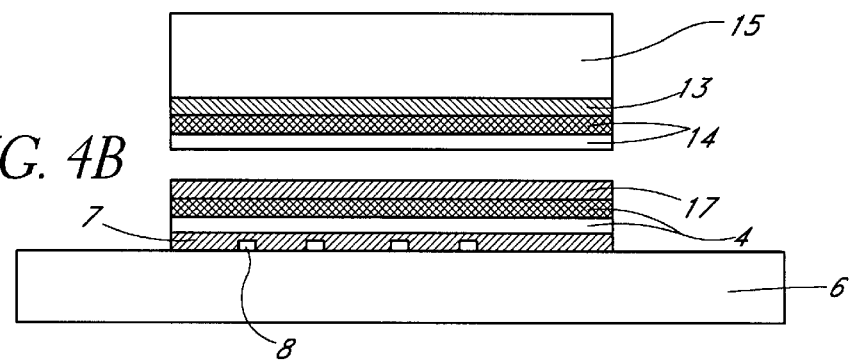
Figure 4C:
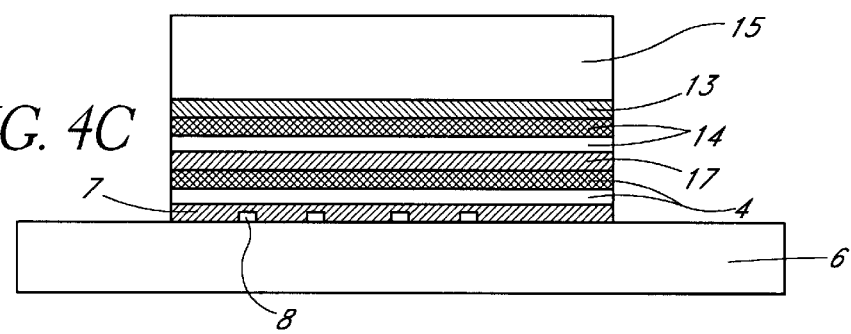
Figure 4D:
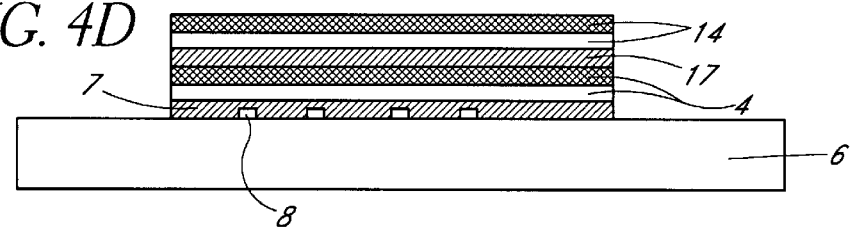
Figure 4E:
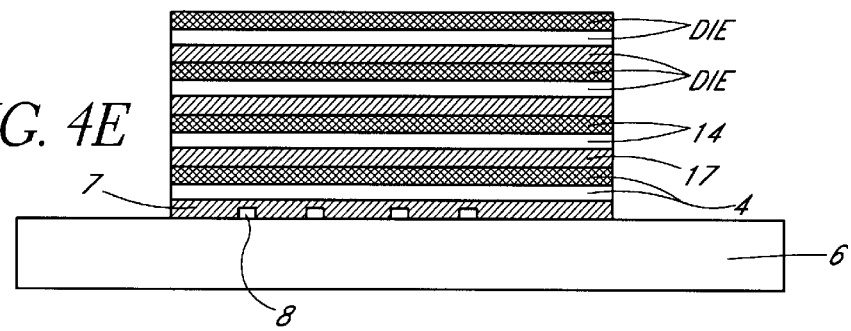

The above process may be repeated to produce a three dimensional stack 9 of dies 4 as shown schematically in FIGS. 4A to E. The starting point is the product of FIG. 3F onto which a further thin layer 17 of BCB is spun-coated (FIG. 4A) in order to planarise the surface and to provide an adhesive layer 17 for the next die 14 as shown schematically in FIG. 4B. Die 14 is applied to the adhesive layer 17 having been pre-attached to a carrier 15 using a release layer 13 such as soluble photoresist as described above for carrier 5, release layer 3 and die 4 (FIG. 4C). The carrier 15 and the photoresist 13 are then removed as described above and the adhesive layer 17 baked to complete cure (FIG. 4D). This process may be repeated many times to produce a stack 9 of dies 4 as shown in schematically in FIG. 4E. Each individual layer of stack 9 (each made up of a die including active devices and an adhesive layer) may be thin, e.g. less than 300 microns, preferably less than 150 microns and more preferably less than 100 microns thick and typically 25 microns thick resulting in a very compact device in comparison with conventional stacks as well as having excellent thermal properties. Thermal bridges 8 may be placed in any of the adhesive layers 7, 17, etc. to improve the thermal characteristics of the stack 9.

In the above description of the first embodiment the adhesive polymer layer 7 was applied to the second substrate 6 in step S3 however the present invention also includes applying the adhesive layer 7 (e.g. by spin-coating) to the surface of die 4 which has been exposed by thinning. The transfer of the die 4 to the second substrate 6 may then be carried out in accordance with steps S4 to S9 above. Note, however, that the application of the adhesive as described for step S3 is preferred as it planarises the surface of substrate 6. The planarisation of the thinned surface of the die 4 is normally achieved adequately during the thinning process of substrate 1 and therefore a further planarisation is not necessary. If necessary a polishing step may be applied after thinning substrate 1 in order to improve the planarisation of the surface of the die 4.

Figure 5A:
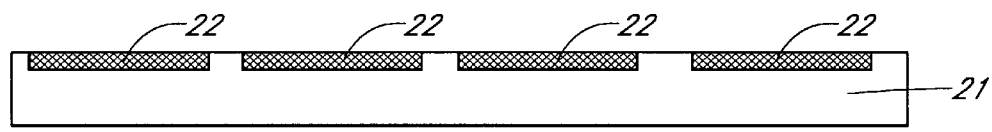
FIGS. 5A to 5J show schematic manufacturing steps for transferring ultra-thin substrates in accordance with further embodiments of the present invention.
Figure 5B:
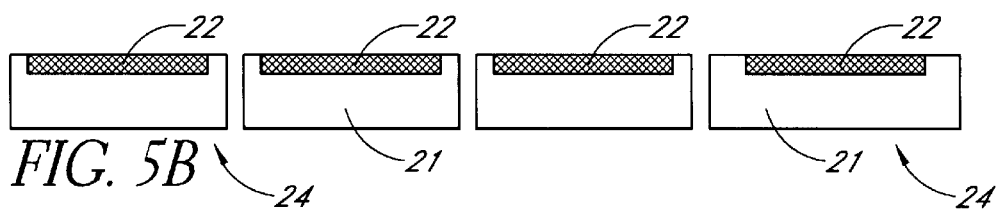
Figure 5C:
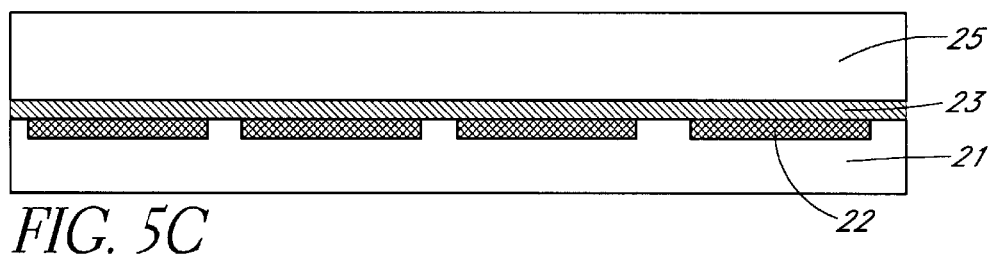
Figure 5D:
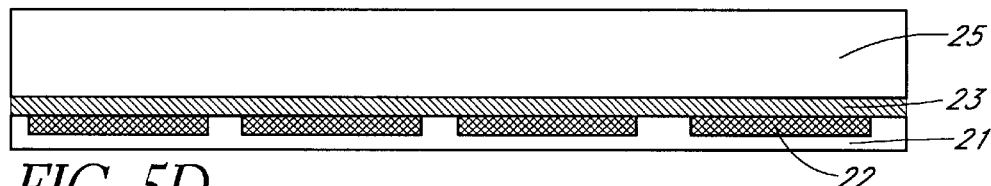
Figure 5E:
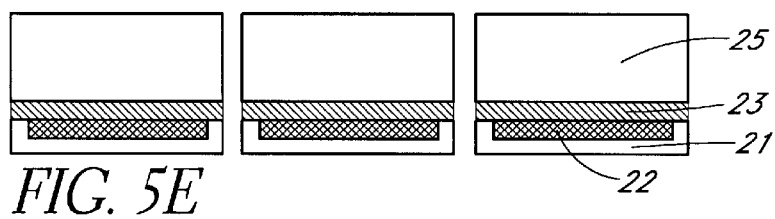
Figure 5F:
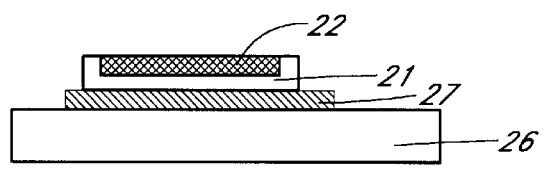

In accordance with a second embodiment a plurality of devices 22 are formed in a wafer 21 as shown schematically in FIG. 5A. Devices 22 may be similar to any of the devices 2 described above with respect to the first embodiment. Wafer 21 may be any suitable wafer such as, for example, a single crystal silicon wafer, a silicon on glass or a silicon on sapphire wafer or a quartz wafer. The wafer 21 may be diced to produce individual thick dies 24 (FIG. 5B). Each die 24 may be processed as above by attaching a carrier 5 with a release layer 3 and transferred and attached to a second substrate 6 and optionally to form a stack 9 as described above for the first embodiment. Alternatively, all the dies 24 may be attached to a carrier 25 using a release layer 23, e.g. photoresist, as shown schematically in FIG. 5C. Substrate 21 may then be thinned by any conventional technique (FIG. 5E). The laminate may then be sawn into die laminates 25, 23, 21 as shown in FIG. 5E. Each of these die laminates 25, 23, 21 is then cleaned to remove any debris caused by the sawing operation and attached to a second substrate 26 by the methods described above using a polymer adhesive layer 27 (FIG. 5F) including removal of the carrier 25 and release layer 23. Alternatively, the wafer of FIG. 5C may be sawn into die laminates and the substrate 21 of each laminate thinned individually before attachment to a further substrate 26 using an adhesive layer 27 and removal of the carrier 25 and release layer 23 (not shown).

Figure 5G:
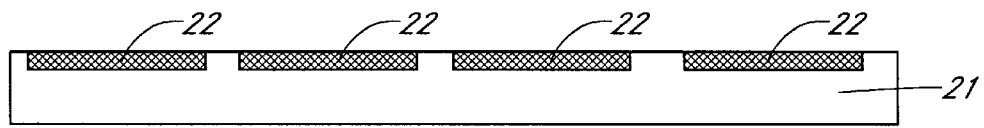
Figure 5H:
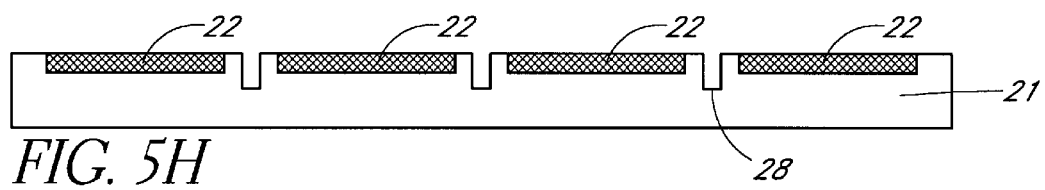
Figure 5I:
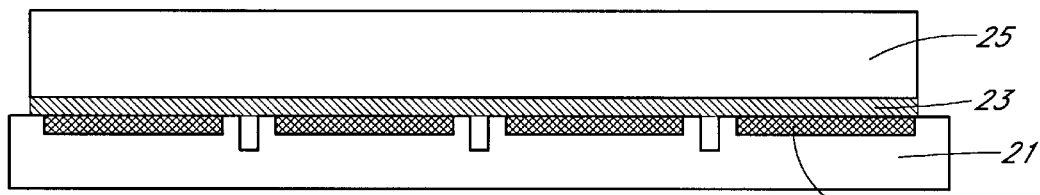
Figure 5J:
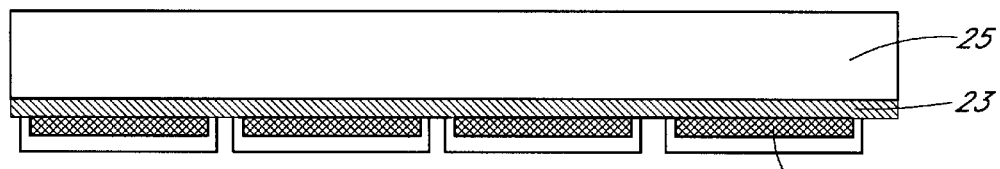

In accordance with a modification of the second embodiment the plurality of devices 22 are singulated on the carrier before transfer. The devices 22 are formed in a wafer 21 as shown schematically in FIG. 5G. Devices 22 may be similar to any of the devices 2 described above with respect to the first or second embodiment. Wafer 21 may be any suitable wafer such as, for example, a single crystal silicon wafer, a silicon on glass or a silicon on sapphire wafer or a quartz wafer. Micro-trenches 28 are then formed in the same major surface of the wafer 21 as the devices 22. The trenches 28 are micro-machined, e.g. by dicing or dry etching in perpendicular directions in the surface of the wafer 21 and to such a depth into the wafer 21 that the trenches 28 extend further into the wafer 21 towards the other major surface of the wafer 21 than the devices 22 to form separated dies 24 (FIG. 5H). The micro-trenches are preferably accurately referenced to the pad layout of the completed devices 22. The wafer 21 and the dies 24 are attached to a carrier 25 using a release layer 23 as shown schematically in FIG. 5I. The release layer 23 may be an organic or polymeric adhesive such as a wax, a photoresist or a light releasable (e.g. UV) adhesive layer. Substrate 21 is then be thinned by any conventional technique to such a depth that the trenches are reached (FIG. 5J). The laminate may then be sawn or diced into die laminates 25, 23, 21 similar to those shown as shown in FIG. 5E. Preferably the die laminates are formed by dicing along the predetermined micro-trenches 28 thus keeping the very accurate contours of the dies 24. This allows alignment on a substrate 26 using the accurately defined edges of the dies 24 (similar to FIG. 5F). Each of these die laminates 25, 23, 21 may optionally be cleaned to remove any debris caused by the sawing or dicing operation and attached to the second substrate 26 by the methods described above using a polymer adhesive layer 27 (FIG. 5F) including removal of the carrier 25 and release layer 23.

Figure 6A:
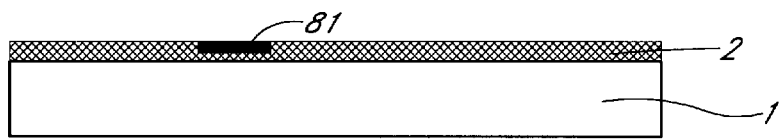
FIGS. 6A to 6I show schematic manufacturing steps for transferring ultra-thin substrates in accordance with another embodiment of the present invention.
Figure 6B:
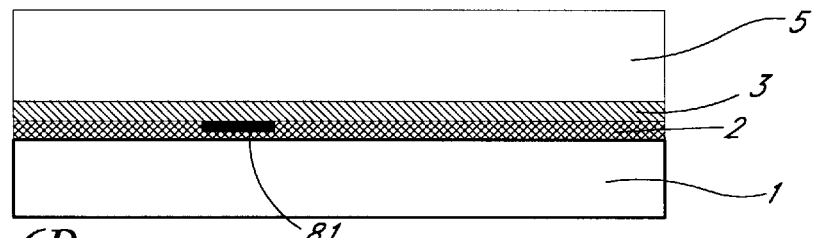
Figure 6C:
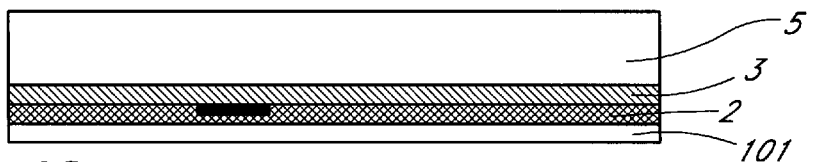
Figure 6D:
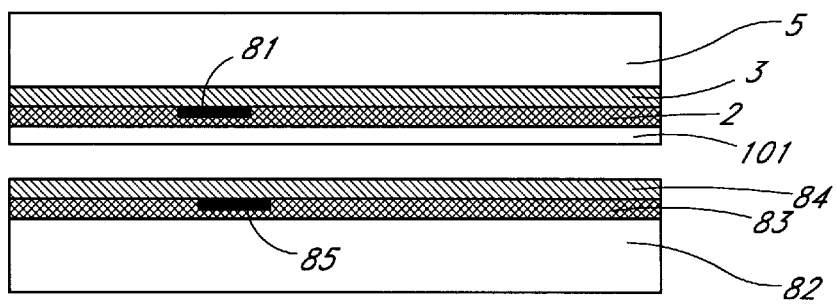
Figure 6E:
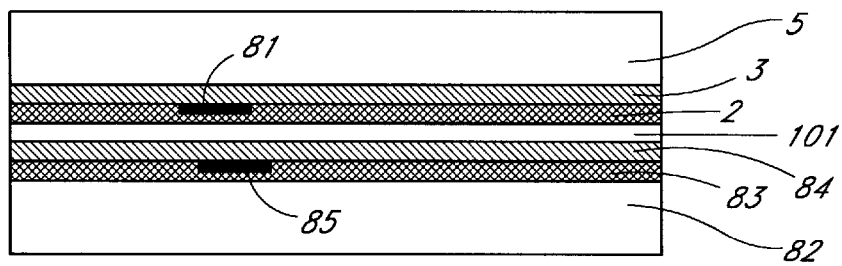
Figure 6F:
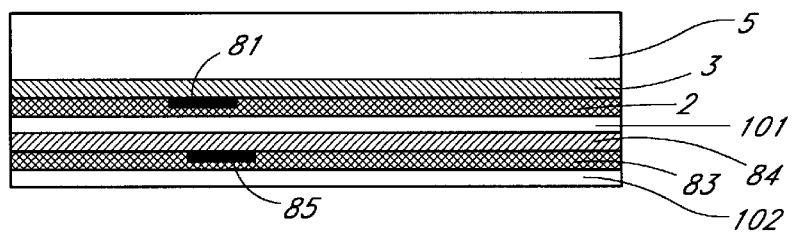
Figure 6G:
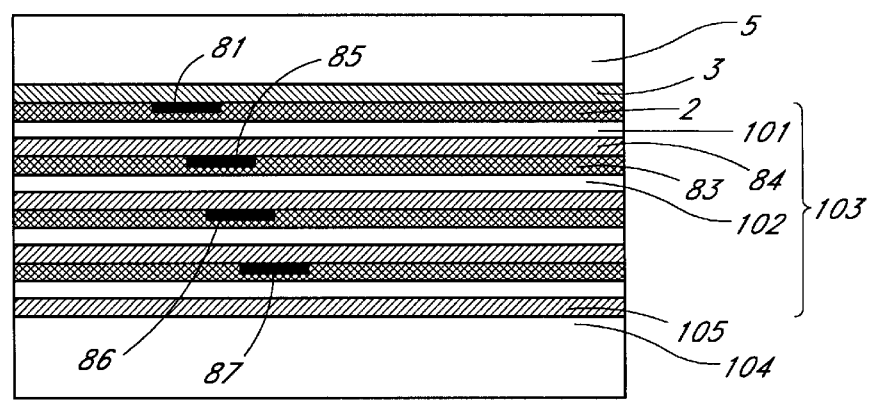
Figure 6H:
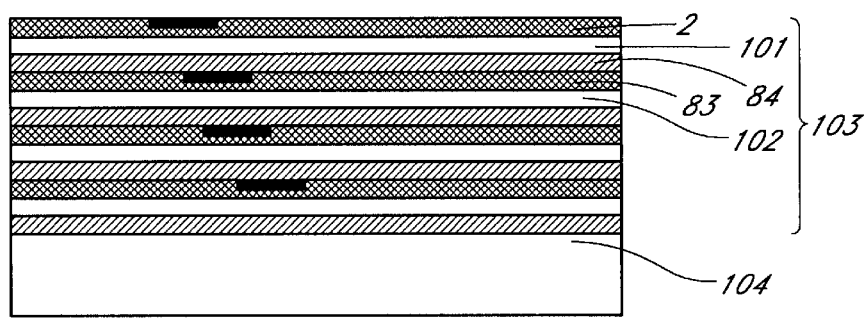
Figure 6I:
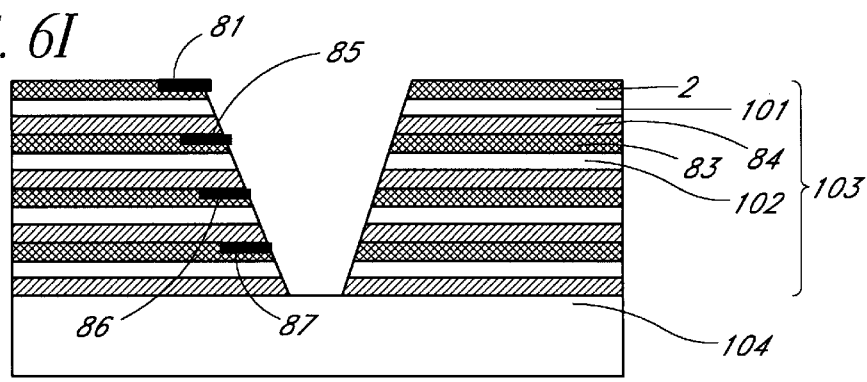

A third embodiment of the present invention will be described with reference to FIGS. 6A to I which is particularly useful for the production of three dimensional memory units. The starting material is a substrate 1, e.g. a semiconductor substrate, onto which is formed or deposited a layer 2 including active or passive devices (FIG. 6A), e.g. memory cells. A metallisation layer may be applied to the surface of the layer 2 of active and/or passive devices and may include one or more bonding pads 81. Substrate 1 is attached to a carrier 5 by a release layer, e.g. solvent removable photoresist, as described above (FIG. 6B). Substrate 1 is then thinned by conventional techniques, such as chemical or mechanical grinding and/or polishing, to form an ultra-thin substrate 101 which may have a thickness of about 5 to 25 micron (FIG. 6C). A second substrate 82, e.g. a semiconductor substrate, is prepared with a layer 83 of active or passive devices (FIG. 6D). An optional metallisation layer with one or more bonding pads 85 may also be provided. This substrate 82 is attached to the thinned side of substrate 101 using an adhesive layer 84, e.g. a polymer adhesive layer such as BCB (FIG. 6E) which is softened by heating before adhesion. Substrate 82 is then thinned to form a second ultrathin substrate 102 (FIG. 6F), e.g. 5 to 25 micron thickness. The above processes are repeated to form a stack 103 of device layers attached to a substrate 104 by an adhesive layer 105 and attached to the carrier 5 via a release layer 3 (FIG. 6G). Each device layer in the stack 103 may include one or more bonding pads 81, 85, 86, 87. The adhesive layers 84 . . . 105 in the stack are now baked at a suitable temperature, e.g. about 120° C., to make them resistant to solvents such as acetone. The carrier 5 is then removed from the stack by dissolving away the release layer 3 in a suitable solvent, e.g. acetone (FIG. 6H). The stack 103 is then baked to completely cross-link the adhesive layers 84 . . . 105. Finally, the stack 103 may be etched or grooved to form a groove 106 through all the layers of stack 103 (FIG. 6I). This groove 106 may allow access to all the metallisation device layers in stack 103, e.g. the bonding pads 81, 85, 86, 87 may be exposed. Contact metallisation (not shown) may be applied to the surfaces of the groove 106 to make contacts with the metallisations of the device layers.

Figure 7A:
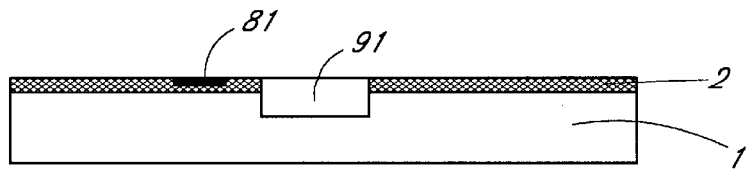
FIGS. 7A to 7I show schematic manufacturing steps for transferring ultra-thin substrates in accordance with another embodiment of the present invention.
Figure 7B:
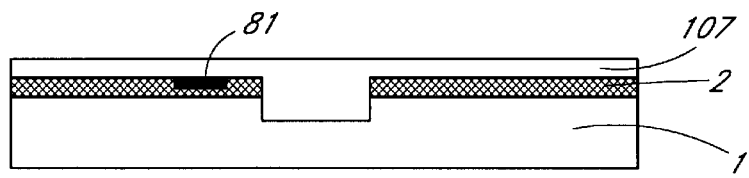
Figure 7C:
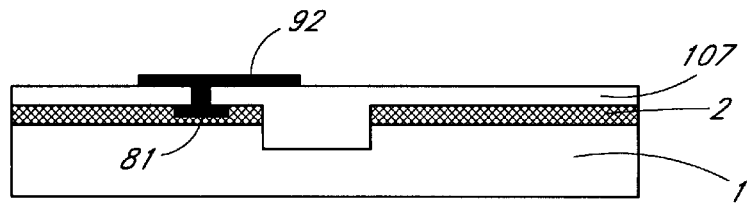
Figure 7D:
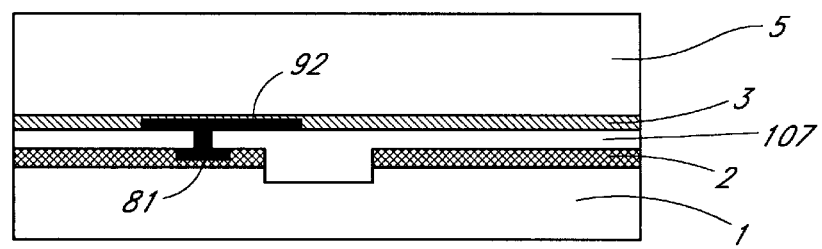
Figure 7E:
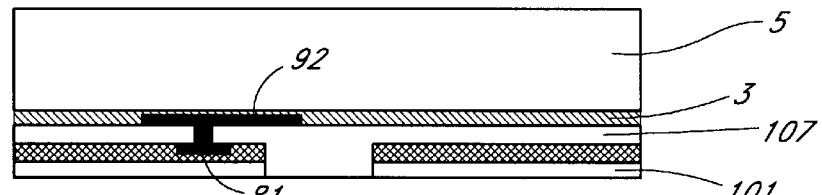
Figure 7F:
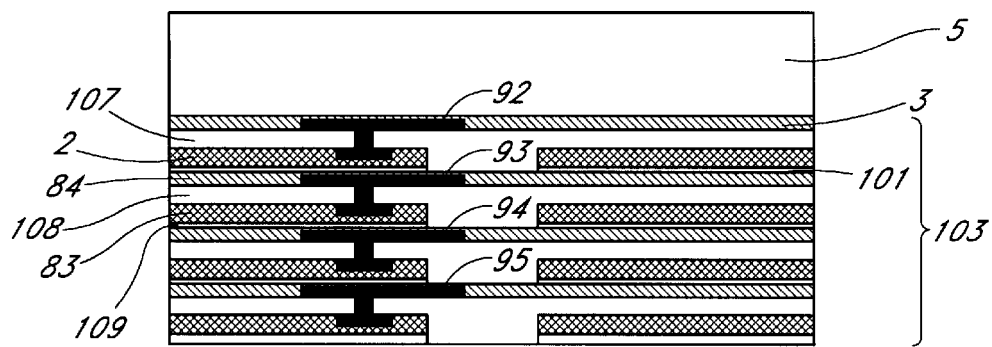

A fourth embodiment of the present invention will be described with reference to FIGS. 7A to I. The starting material is a substrate 1 with a layer 2 deposited or formed thereon or therein which may include active or passive devices. The layer 2 may also include a metallisation layer including one or more bonding pads 81. A trench 91 is then formed, e.g. by etching, ion milling or similar through device layer 2 into substrate 1 (FIG. 7A). A layer 107 of insulating material, e.g. a BCB layer is then deposited over the complete surface of the device layer 2 filling the trench 91 (FIG. 7B). The insulating layer 107 is then patterned by conventional techniques to form a via hole above the bonding pad 81. A metallisation layer is then deposited and patterned to form a metallisation strip 92 (FIG. 7C). The strip 92 extends so that it overlaps the trench 91. The top surface of insulating layer 107 is then adhered to a carrier 5 by a release layer 3 such as a solvent release layer, e.g. photoresist (FIG. 7D). Substrate 1 is then thinned by conventional techniques to form an ultra-thin substrate 101. The thinning should be sufficient to make contact with the bottom of the trench of the insulating layer 107 (FIG. 7E). A further substrate is prepared with a device layer 83, an insulating layer 108 and a metallisation strip 92 which is attached to the under side of the substrate 101 by a polymeric adhesive layer, e.g. BCB, 84 (FIG. 7F). The substrate is thinned to an ultrathin substrate 109.

Figure 7G:
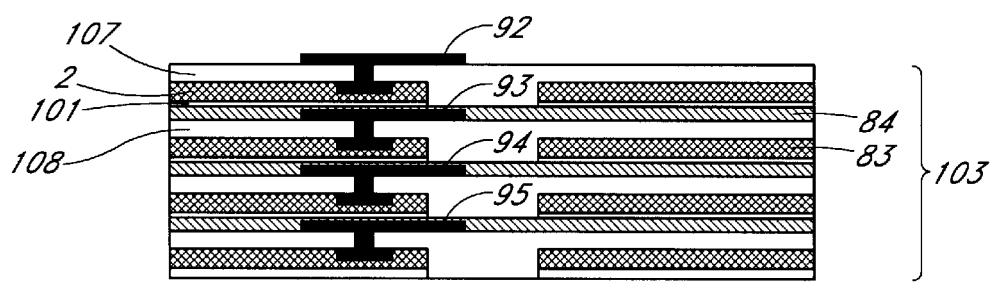

The above process is repeated and continued until a stack 103 of device layers 2, 83 . . . , thinned substrates 101, 109 . . . and insulating layers 107, 108 . . . is obtained (FIG. 7F). Each layer may have one or more metallisation strips 92–95. The trenches of the insulating layers 107, 108 are preferably aligned one above the other. The adhesive layers 84 . . . are partially cross-linked by raising the temperature of the stack 103, e.g. to 120° C. After partial cross-linking the carrier 5 is removed by a solvent such as acetone (FIG. 7G).

Figure 7H:
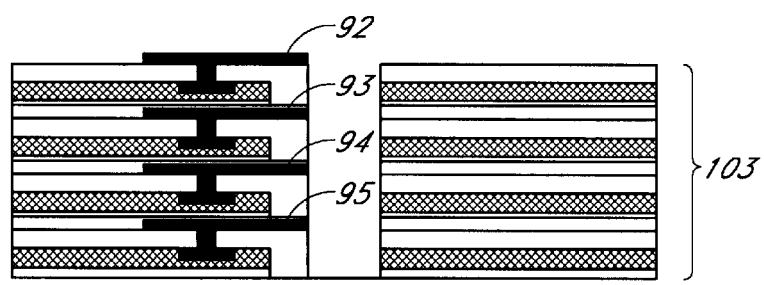
Figure 7I:
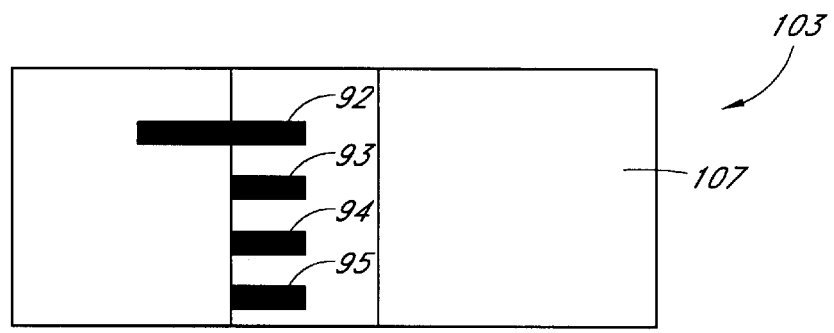

The aligned trenches are then etched or ion milled to expose the metallisation strips 92–95 (FIG. 7H). As shown in FIG. 7I which is a top view of the device, the metallisation strips 92–95 may be offset from each other, so that each may be accessed separately. A suitable metallisation may then be applied (not shown).

In accordance with a fifth embodiment of the present invention the above method of attaching ultra-thin dies to a substrate to form a stack may be used to form a multi-layer thin film device 70 including a three-dimensional structure which includes a three-dimensional interconnect 71 for connecting to the semiconductor device portion 72 which may include a stack of semiconductor device layers 73 as shown schematically in FIG. 8. The multi-layer thin film device 70 is very compact and has excellent thermal properties. The three-dimensional interconnect 71 in accordance with the present invention includes connection paths or wiring layers or connections in all three orthogonal space filling dimensions, i.e. X, Y and Z routing, for interconnecting the semiconductor devices in the device layers 73 among themselves and to external.

Figure 9D:
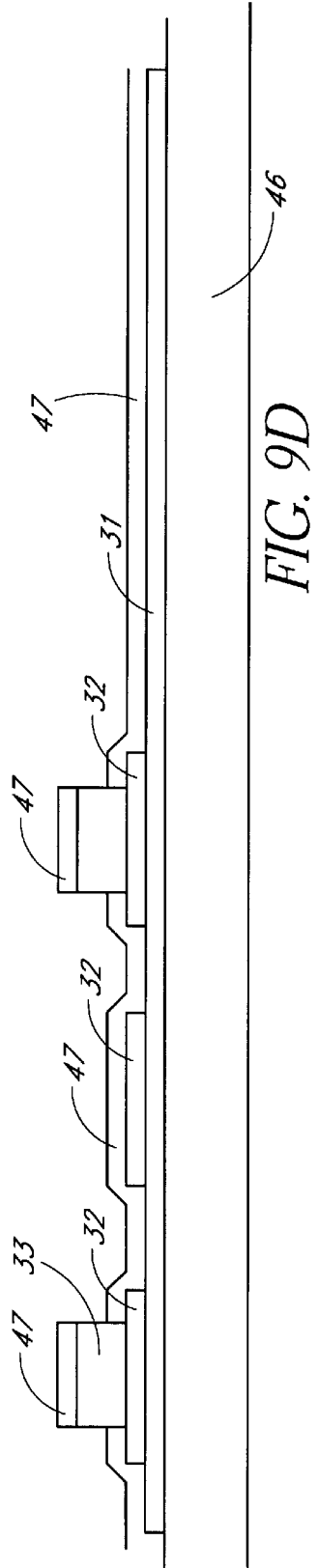
Figure 9E:
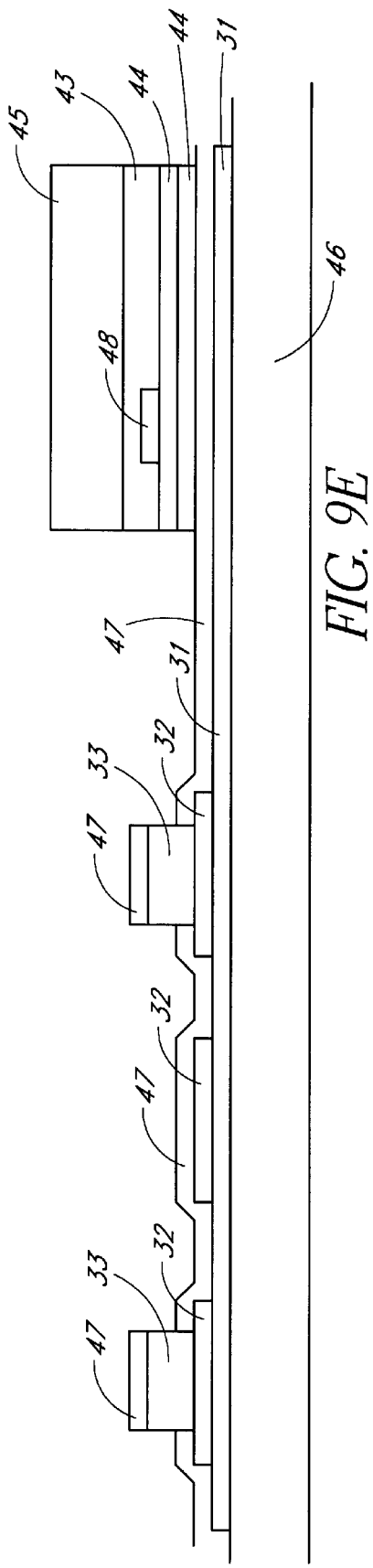

A preferred method and multi-layer thin film device 70 in accordance with the fifth embodiment will be described with reference to FIGS. 9A to K. A substrate 46 is first prepared. This substrate 46 may be any suitable substrate, in particular, any substrate which may be used for MCM processing such as single crystal silicon, silicon on glass, silicon on sapphire, alumina, aluminium. An insulating layer 31 is then optionally deposited (FIG. 9A). Layer 31 may be any suitable insulating layer such as, for example, an oxide layer or a spin-coated BCB layer or layers which has (have) a high level of planarisation, e.g. 80% or better, more preferably 85% or better. The insulating layer 31 may have a thickness of between 1 and 5. A first interconnection metallisation 32 is deposited onto the insulating layer 31 and patterned in accordance with conventional techniques (FIG. 9B). For instance, the first interconnection metallisation 32 may include a 2 micron Ti/Cu/Ti laminate. The first metallisation 32 may be produced by magnetron sputtering of a 30 nm/2 micron/30 nm Ti/Cu/Ti wiring layer with a wiring line thickness of 10 micron and a wiring line spacing of 20 micron. Alternatively, the first metallisation may be formed by pattern plating copper wiring lines. First a tin seed layer is sputtered followed by the deposition and patterning of a 15 micron thick resist. The resist is patterned and the copper metal is plated in the resist openings using a jet-plating method. The wiring lines may be a small as 10 micron in width and 10 micron in thickness.

The first interconnection metallisation 32 forms part of the X and Y routing of the interconnect 71 (the dimensions X and Y are orthogonal and lie in the plane of the substrate 46. The Z direction is perpendicular to this plane.). The X and Y routing 32 may be applied typically with a pitch of 50 microns or less and the position of the individual metallisation elements may be freely selected. Next metal, e.g. copper, studs 33 are plated onto at least a part of the first interconnection metallisation 32 (FIG. 9C). The height of the metals studs 33 is preferably chosen to be approximately the same thickness as the thinned die 44 which will be applied in the next steps, e.g. at least 50 percent, preferably 75 percent or more thereof. The studs 33 form part of the Z routing of the interconnect 71 in accordance with the present invention. The Z routing in accordance with the present invention may typically have a pitch of 100 micron or less.

The studs 33 may be produced in a jet-plating cell. Alternatively a conventional parallel plate plating cell may be used. Between the anode of the cell and a substrate 46 an anode shield may be placed. This anode may be a solid plate with holes approximately the size of the substrate to be plated. This is done to obtain a more homogeneous plating. The obtained plating results obtained in this bath may be summarised as:

Plating current 1 A/dm2: +/−0.16 $\mu$m/min: uniformity over wafer=+/−6%

Plating current 3 A/dm2: +/−0.50 $\mu$m/min: uniformity over wafer=+/−15%

The plating uniformity between neighbouring features of different size is typically better than 3%. A plating non-uniformity up to 10% is acceptable for the studs 33 in accordance with the present invention, Therefore a plating speed of around 0.25 micron/min may be used.

In order to realise the small studs 33, the plating may be performed using a thick photoresist such as AZ4562. This resist is applied as a 15 to 20 $\mu$m thick layer. It has an excellent resolution and a high resistance to plating solutions. Studs 33 may be in the range 10 to 80 $\mu$m in diameter with a thickness of between 5 $\mu$m and 12 $\mu$m in height.

A thin coating of a polymer adhesive layer 47 is now applied to the complete surface of the substrate 46 (FIG.

9D). For instance, the adhesive layer 47 is preferably a thin polymer layer such as a spin-coated BCB layer. The BCB layer 47 preferably has a thickness of 1 to 5 micron. Preferably, Cyclotene™ 3202 from Dow is used for the layer 47. The BCB layer 47 is now pre-baked for 30 min at 30C. A thinned die 44 is now transferred to, aligned with and attached to the BCB layer 47 by any of the techniques for transfer of ultra-thin substrates as described above (FIG. 9E). For example the thinned die 44 is attached onto the soft BCB layer 47 using carrier 45 as a support attached to the die 44 by a release layer 43, e.g. photoresist. Die 44 is preferably an integrated circuit having die bond pads 48 for electrical connection thereto. The temperature at BCB—die interface is preferably maintained at about 70° C., and the applied pressure to the die 44 is preferably about 80 kPa. The BCB layer 47 is now post-baked the for 2 hours at 120C (below the melting temperature of the release layer 43) in a nitrogen atmosphere. After this thermal treatment, the adhesive layer 47 is partly hardened and it is resistant to solvents such as acetone. The carrier 45 may be removed by placing the laminate 43, 44, 45, 46, 47 in a solvent such as acetone but the present invention is not limited thereto. The carrier 45 may be removed with a vacuum pipette. Any remaining photoresist on the surface of the die 44 may be removed by dipping in an acetone bath at room temperature. Finally, the BCB layer 47 is completely cured using the BCB curing profile recommended by the supplier of the BCB (FIG. 9F).

A thick photo-BCB layer 34 is now applied to the complete surface of substrate 46, e.g. by spin-coating. Photo-BCB is a photosensitive BCB material available, for instance, from Dow (Cyclotene™ 4202 is particularly preferred). The photo-BCB layer 34 is patterned and vias 35 opened on studs 33 and a cavity 36 opened on and around the die 44 (FIG. 9G). A second thin photo-BCB layer 37 is deposited on the complete surface of the substrate 46 and patterned to open the vias 35 on the studs 33 again and to open vias 38 on the die bond pads 48 (FIG. 9H). The upper surface of the substrate 46 is now dry etched to remove any BCB residues in the via holes 35, 38 and to remove any adhesive layer residues on the studs 33. Because of the height of the studs 33, the adhesive layer 47 on top of the studs 33 will be significantly thinner than below the die 44.

Figure 9I:
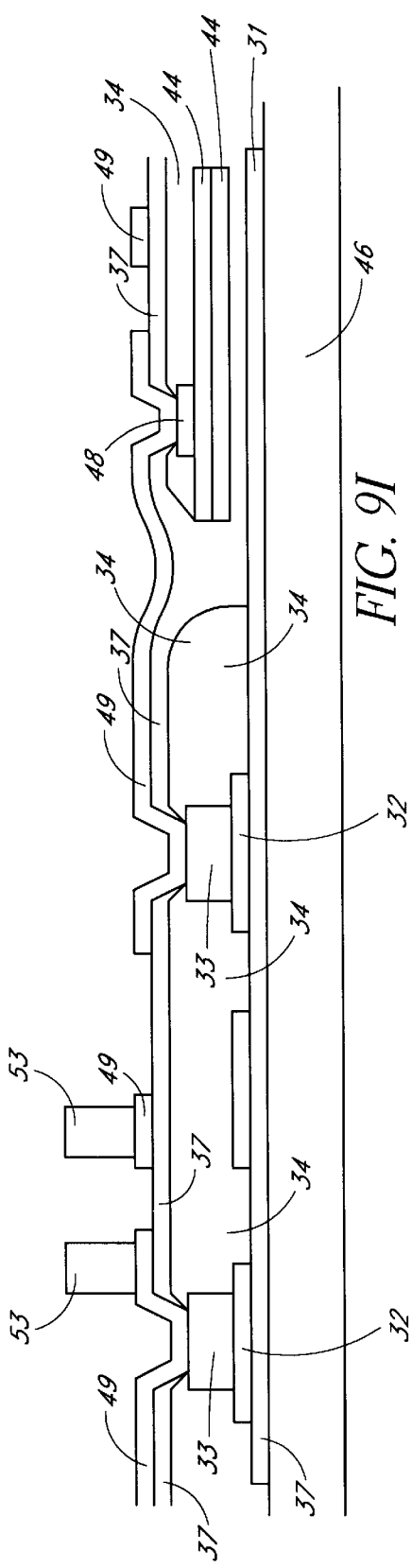
Figure 9J:
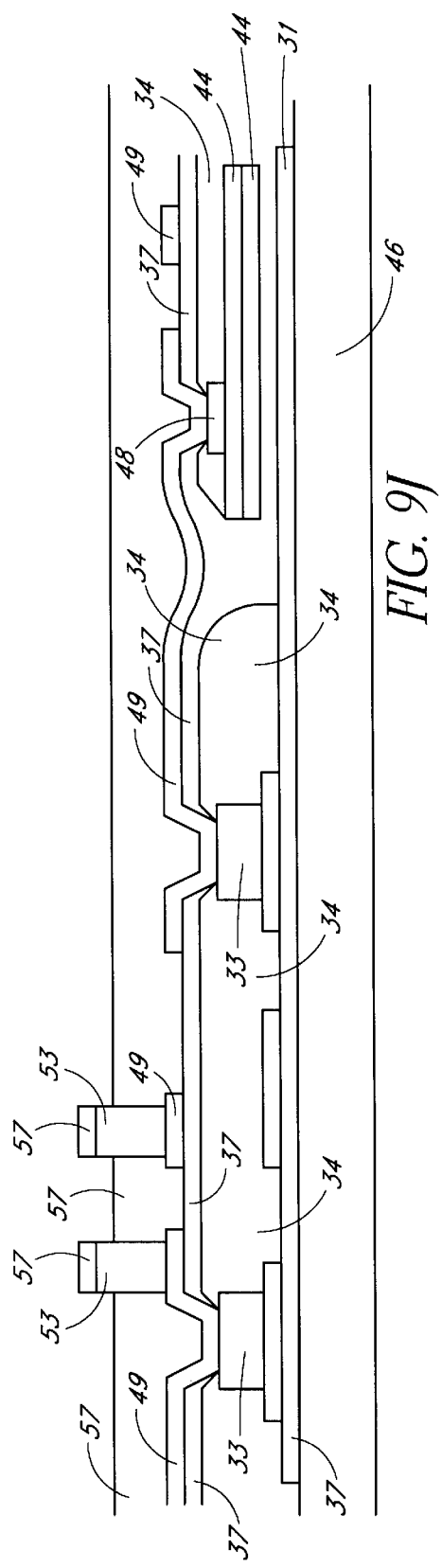
Figure 9K:
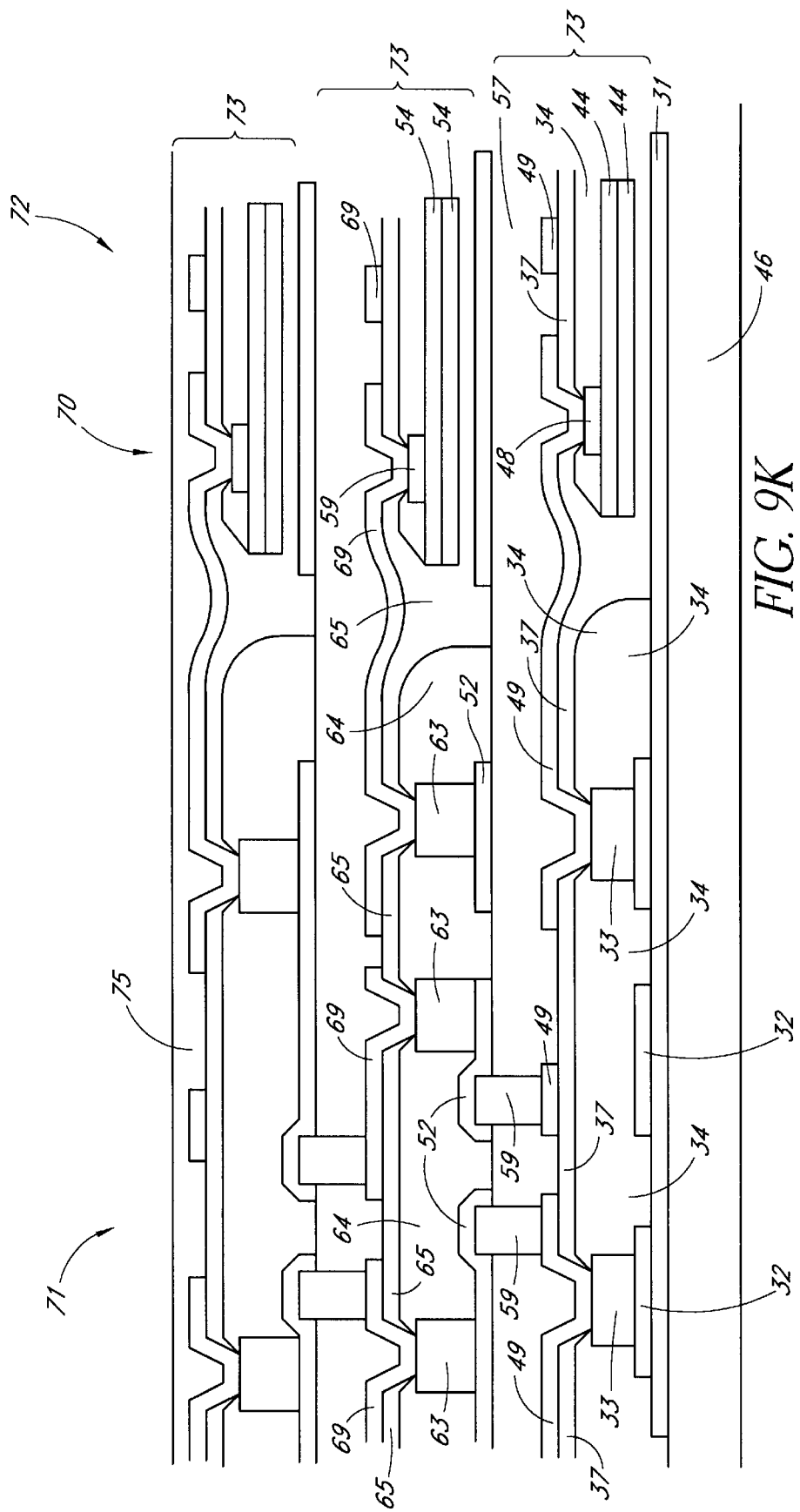

Next a second metallisation layer 49 is applied which contacts the studs 33 and the die pads 48 (FIG. 9I). This metallisation layer may be a Ti/Cu/Ti layer, e.g. 30 nm/2 micron/30 nm respectively. The second metallisation layer 49 forms part of the X and Y routing of the interconnect 71 in accordance with the present invention. The X and Y routing may have a pitch of 50 microns or less. Interlayer studs 53 are now plated onto the second metallisation layer 49 to provide a part of the Z routing of the interconnect 71 between the layers 73 of the final device 70. Studs 53 do not have to be aligned with studs 33 and their position may be chosen freely. The Z routing may have a pitch of 100 microns or less. Finally, the upper surface of the substrate 46 is planarised with a spun-coated BCB layer 57 (FIG. 9J) which will also form the planarised base for placing the next die 54.

The sequence of operations described above may now repeated with the next layer of the semiconductor device portion 72 and the interconnect 71 which includes a third metallisation layer 52, a thin polymer adhesive layer (BCB) 67, a thinned die 54 with die pads 59, studs 63, first photo-BCB layer 64, a second photo-BCB layer 65 and a fourth interconnect metallisation 69. The thinned die 54 need not be in alignment with the die 44. Instead its position may be freely chosen. The studs 63 need not be aligned with the studs 53 or 33, their position may be freely chosen. More layers can be added to form a final three dimensional structure of a multilayer thin film device 70 as shown schematically in FIG. 9K. The final layer 75 may be a passivation layer to protect the complete device 70 and to reduce stresses therein. Each layer 73 of the device 70 may have a thickness of less than 300 microns, preferably less than 150 microns and most preferably less than 100 microns.

A multi-layer thin film device 70 according to the fourth embodiment is shown schematically in top view in FIG. 10A and side-view in FIG. 10B. The device layers 73 are connected electrically to power and ground lines 112, 113 as well as to X, Y, and Z routings 114, e.g. signal wiring typically in the form of one or more busses. To avoid cross-talk it is preferred if the signal routings 114 are microstrip lines or striplines. Both the upper surface and the lower surface of each device layer 73 may be provided with metallisation layers 111 for connection to the power or ground wires 112, 113 and signal routings 114. The above multi-layer thin film device 70 has an interconnect 71 in which the X, Y and Z routing a freely selectable in their position. Further, the semiconductor devices, e.g. the dies 44, 54 of a layer 73 are ultra-thin and may be safely transferred by the transfer method described with reference to the above embodiments. This provides for a very compact design. Further, the compact design provides a multi-thin film device 70 with excellent thermal properties.

While the invention has been shown and described with reference to preferred embodiments, it will be understood by those skilled in the art that various changes or modifications in form and detail may be made without departing from the scope and spirit of this invention as defined in the attached claims. For instance, the multi-layer thin film device 70 has been described above with reference to only one die per device layer 73. The present invention also includes a plurality of dies in one or more layers of device 70.

Further, the thermal bridges 8 have been described with reference to the stack and manufacturing method shown in FIG. 4 but the present invention specifically includes using thermal bridges 8 in any of the polymeric adhesive layers in each or any of the embodiments of the present invention.

What is claimed is:

1. A method of transfer of a first planar substrate with two major surfaces to a second substrate, comprising the steps of:

forming the first planar substrate, attaching one of the major surfaces of the first planar substrate to a carrier by means of a release layer;

attaching the other major surface of the first substrate to the second substrate with a curable polymer adhesive layer;

partly curing the polymer adhesive layer, which is between the first substrate and the second substrate;

disconnecting the release layer from the first substrate to separate the first substrate from the carrier, followed by curing curing the polymer adhesive layer.

2. The method according to claim 1, wherein the curable adhesive is applied to the second substrate before the attaching step.

3. The method according to claim 1, further comprising the step of thinning the first substrate after the attaching step and before the disconnecting step.

4. The method according to claim 3, further comprising the steps of: forming micro-trenches in the one major surface of the first substrate and partly extending theretrough before attaching the carrier; and thinning the first substrate after the attaching step and before the disconnecting step as far as the micro-trenches.

5. The method according to claim 3, wherein the thinned first substrate has a thickness of 3 to 50 micron, more preferably 5 to 25 micros.

6. The method according to claim 3, further comprising the step of attaching a second substrate to the thinned exposed surface of the first substrate before the disconnecting step.

7. The method according to claim 1, further comprising the step of:

attaching a third substrate to the exposed surface of the first substrate after the disconnecting step.

8. The method according to claim 1, wherein the first substrate includes active and/or passive electronic devices.

9. The method according to claim 1, wherein the release layer includes one of a solvent removable layer, a heat releasable layer and a light removable layer.

10. The method according to any of the previous claims, wherein the first substrate includes a semiconductor substrate.

11. The method according to claim 1, wherein the polymer adhesive layer is BCB.

12. A method of transfer of a first planar substrate with two major surfaces to a second substrate, comprising the steps of:

forming the first planar substrate, forming micro-trenches in one of the major surfaces of the first substrate and partly extending there through;

attaching one of the major surfaces of the first planar substrate to a carrier by means of a release layer;

thinning the first substrate as far as the micro-trenches;

attaching the other major surface of the first substrate to the second substrate with a curable polymer adhesive layer;

partly curing the polymer adhesive layer, disconnecting the release layer from the first substrate to separate the first substrate from the carrier, followed by curing the polymer adhesive layer.

* * * * *

UNITED STATES PATENT AND TRADEMARK OFFICE
CERTIFICATE OF CORRECTION

PATENT NO. : 6,506,664 B1
DATED : January 14, 2003
INVENTOR(S) : Beyne et al.

It is certified that error appears in the above-identified patent and that said Letters Patent is hereby corrected as shown below:

Column 13,
Line 6, please delete "micros" and insert -- micron --.

Signed and Sealed this

Twenty-ninth Day of June, 2004

JON W. DUDAS
*Acting Director of the United States Patent and Trademark Office*